United States Patent
Oue

(10) Patent No.: US 11,762,135 B2
(45) Date of Patent: Sep. 19, 2023

(54) DEVICE AND METHOD FOR PRODUCING MASTER DIFFRACTION GRATING

(71) Applicant: Shimadzu Corporation, Kyoto (JP)

(72) Inventor: Yuki Oue, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 596 days.

(21) Appl. No.: 16/980,425

(22) PCT Filed: Jun. 20, 2018

(86) PCT No.: PCT/JP2018/023453
§ 371 (c)(1),
(2) Date: Sep. 14, 2020

(87) PCT Pub. No.: WO2019/244274
PCT Pub. Date: Dec. 26, 2019

(65) Prior Publication Data
US 2021/0003752 A1   Jan. 7, 2021

(51) Int. Cl.
*G02B 5/18*   (2006.01)
*G03F 7/00*   (2006.01)
*G03H 1/22*   (2006.01)

(52) U.S. Cl.
CPC .......... *G02B 5/1857* (2013.01); *G03F 7/0005* (2013.01); *G03H 1/2202* (2013.01); *G03H 2001/2231* (2013.01); *G03H 2223/23* (2013.01)

(58) Field of Classification Search
CPC ...... G06F 40/205; G06F 40/268; G06F 40/30; G06Q 40/02; G07D 7/0032; G03H 1/0011;
(Continued)

(56) References Cited

U.S. PATENT DOCUMENTS 4,148,549 A * 4/1979 Termanis ............... G02B 5/32
359/900
5,007,709 A * 4/1991 Iida ....................... G02B 5/1857
359/569
(Continued)

FOREIGN PATENT DOCUMENTS

JP   H0634807    2/1994
JP   H07140310   6/1995
JP   2014215375  11/2014

OTHER PUBLICATIONS

"International Search Report (Form PCT/ISA/210) of PCT/JP2018/023453," dated Sep. 18, 2018, with English translation thereof, pp. 1-4.
"Written Opinion of the International Searching Authority (Form PCT/ISA/237) of PCT/JP2018/023453," dated Sep. 18, 2018, with partial English translation thereof, pp. 1-5.

*Primary Examiner* — Deoram Persaud
(74) *Attorney, Agent, or Firm* — JCIPRNET

(57) ABSTRACT

A device for producing a master diffraction grating includes a light source unit and a reflecting member 11. The light source unit forms a first interference fringe by irradiating a substrate surface of a master substrate 101 with light. The reflecting member 11 reflects the light from the light source unit reflected on the substrate surface of the master substrate 101 and guides the light again to the substrate surface side to form a second interference fringe. A resist pattern based on the first interference fringe and the second interference fringe is formed on the substrate surface of the master substrate 101.

6 Claims, 5 Drawing Sheets

(58) Field of Classification Search
CPC .............. G03H 1/0244; G03H 1/0402; G03H 1/0465; G03H 1/2202; G03H 1/265; G03H 1/28; G03H 2001/0469; G03H 2001/0473; G03H 2001/2231; G03H 2223/23; G03H 2223/24; G03F 7/0005; G03F 7/70408; B42D 25/328; G02B 5/1857; G02B 5/32; G08G 1/096791; G08G 1/163; G08G 1/167; G05D 1/0212; G05D 1/0214; G05D 1/0276; G05D 2201/0213; B60Y 2300/09; B60W 10/04; B60W 10/18; B60W 10/20; B60W 2050/0002; B60W 2556/65; B60W 2756/10; B60W 30/09; B60W 60/0011; B60W 60/0015; B60W 60/0027

See application file for complete search history.

(56) References Cited

U.S. PATENT DOCUMENTS

| | | | |
|---|---|---|---|
| 2006/0216478 A1* | 9/2006 | Nagano | G02B 5/1857 428/156 |
| 2015/0349479 A1* | 12/2015 | Oue | G02B 5/1809 359/571 |
| 2016/0154309 A1* | 6/2016 | Yajima | G02B 5/3025 428/156 |

* cited by examiner (a)

(b)

(c)

(d)

(e)

DEVICE AND METHOD FOR PRODUCING MASTER DIFFRACTION GRATING

CROSS-REFERENCE TO RELATED APPLICATION

This application is a 371 application of the International PCT application serial no. PCT/JP2018/023453, filed on Jun. 20, 2018. The entirety of each of the above-mentioned patent applications is hereby incorporated by reference herein and made a part of this specification.

BACKGROUND

Technical Field

The present invention relates to a device and a method for producing a master diffraction grating, which is a matrix for manufacturing a replica diffraction grating.

Background Art

A method for manufacturing a master diffraction grating and manufacturing a replica diffraction grating using the master diffraction grating is generally known when a diffraction grating is mass-produced (for example, see Patent Document 1 below).

When a master diffraction grating is manufactured, first, a photoresist layer is formed on a substrate surface of a master substrate that is a main body of the master diffraction grating, and the photoresist layer is exposed to form a resist pattern on the surface. Then, etching is performed using the resist pattern as a mask to form a grating pattern having a blazed (serrated) grating groove on the substrate surface. After that, a metal thin film is formed on the grating pattern, so that a master diffraction grating on which a grating surface is formed by the metal thin film can be manufactured.

When a replica diffraction grating is manufactured by using the master diffraction grating manufactured as described above, first, a release agent layer is formed on a surface (grating surface) of the metal thin film of the master diffraction grating, and a metal thin film is formed on the release agent layer. Then, an adhesive such as thermosetting epoxy resin is applied to a surface of the replica substrate that is a main body of the replica diffraction grating, and the replica substrate is bonded to the metal thin film formed on the surface of the master diffraction grating with the adhesive.

After that, the metal thin film on the release agent layer is peeled off at the release agent layer and transferred from the master substrate to the replica substrate, and a replica diffraction grating can be manufactured. In a case a replica diffraction grating is manufactured continuously, the release agent layer is formed again on the surface of the master diffraction grating and the metal thin film is formed on the release agent layer, and then work similar to the above is performed.

PRIOR ART DOCUMENT

Patent Document

Patent Document 1: Japanese Patent Laid-Open No. 2014-215375

SUMMARY

Problems to be Solved by the Invention

As described above, the master diffraction grating serves as a matrix when a replica diffraction grating is manufactured, and the replica diffraction grating manufactured using the master diffraction grating is a genuine product. However, a counterfeit product can also be manufactured by replicating the replica diffraction grating by using the replica diffraction grating as a matrix without using the master diffraction grating. Conventionally, there has been a problem that whether or not a replica diffraction grating counterfeited as described above is a counterfeit product cannot be checked.

The present invention has been made in view of the above circumstances, and an object of the present invention is to provide a device and a method for producing a master diffraction grating that allows easy checking of whether or not a replica diffraction grating is a counterfeit product.

Means for Solving the Problems (1) A device for producing a master diffraction grating according to the present invention is a device for producing a master diffraction grating serving as a matrix for producing a replica diffraction grating. The device includes a light source unit and a reflecting member. The light source unit forms a first interference fringe by irradiating a substrate surface of a master substrate with light. The reflecting member reflects light from the light source unit reflected on the substrate surface of the master substrate and guides the light again to the substrate surface, so that a second interference fringe is formed. A resist pattern based on the first interference fringe and the second interference fringe is formed on the substrate surface of the master substrate.

According to such a configuration, not only the first interference fringe formed by irradiating the substrate surface of the master substrate with light, but also the second interference fringe formed by reflecting the light reflected on the substrate surface of the master substrate on the reflecting member and guiding the light again to the substrate surface is used, so that a resist pattern is formed on the substrate surface of the master substrate. In a case where the replica diffraction grating is produced using the master diffraction grating produced as described above as a matrix, when the grating surface of the replica diffraction grating is irradiated with light of a specific wavelength from a specific direction, a mark having a shape corresponding to the reflected light from the reflecting member is projected in a specific direction. Therefore, whether or not the replica diffraction grating is a counterfeit product can be easily checked based on whether or not a mark is projected.

(2) The reflecting member may be disposed at a position displaced along a direction parallel to a direction in which the first interference fringe extends, with respect to an optical axis of light from the light source unit.

According to such a configuration, when the grating surface of the replica diffraction grating produced using the manufactured master diffraction grating as a matrix is irradiated with light of a specific wavelength from a specific direction, a mark is projected in a direction different from a wavelength dispersion direction by the grating surface. In this manner, a wavelength can be dispersed with performance similar to that in a case where no mark is projected. For this reason, original performance of the replica diffraction grating can be prevented from being impaired.

(3) A method for producing a master diffraction grating according to the present invention is a method for producing a master diffraction grating serving as a matrix for producing a replica diffraction grating. The method includes a resist pattern forming step, a grating pattern forming step, and a film forming step. The resist pattern forming step forms a first interference fringe by irradiating a substrate surface of a master substrate with light from a light source unit, and forming a second interference fringe by reflecting light from the light source unit reflected on the substrate surface of the master substrate on a reflecting member and guiding again the light to the substrate surface, so as to form a resist pattern based on the first interference fringe and the second interference fringe on the substrate surface of the master substrate. The grating pattern forming step forms a grating pattern having a grating groove on the substrate surface of the master substrate by performing etching using the resist pattern as a mask. The film forming step forms a metal thin film on the grating pattern.

Effects of the Invention

According to the present invention, in a case where the replica diffraction grating is produced using a produced master diffraction grating, when the grating surface of the replica diffraction grating is irradiated with light of a specific wavelength from a specific direction, a mark having a shape corresponding to the reflected light from the reflecting member is projected in a specific direction. Accordingly, whether or not a replica diffraction grating is a counterfeit product can be easily checked based on whether or not the mark is projected.

DESCRIPTION OF THE EMBODIMENTS

1. Method of Producing Master Diffraction Grating

Figure 1:
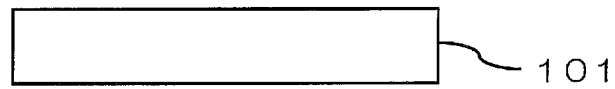
FIG. 1 is a schematic cross-sectional view showing step by step a method of producing a master diffraction grating according to an embodiment of the present invention.
Figure 1:
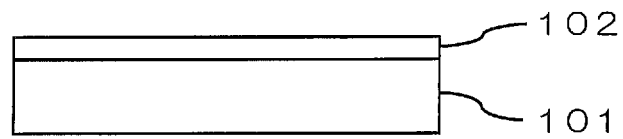
Figure 1:
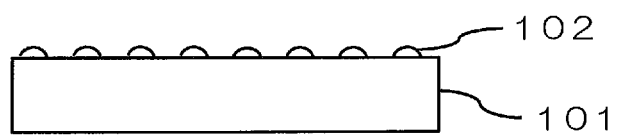
Figure 1:
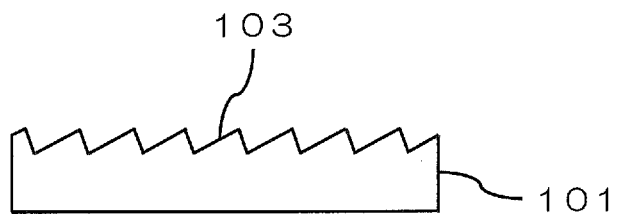
Figure 1:
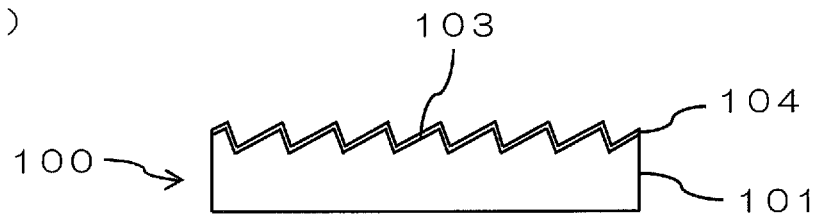

FIG. 1 is a schematic cross-sectional view showing step by step a method of producing a master diffraction grating 100 according to an embodiment of the present invention. The master diffraction grating 100 is used as a matrix when diffraction gratings are mass-produced, and a plurality of replica diffraction gratings can be manufactured using the master diffraction grating.

When the master diffraction grating 100 is manufactured, first, as shown in (a) and (b) of FIG. 1, a photoresist layer 102 is formed on a substrate surface of a master substrate 101 (resist layer forming step). As the master substrate 101, for example, a glass substrate made from BK7, quartz glass, or the like can be used.

A resist pattern is formed on a surface of the photoresist layer 102 formed on the substrate surface of the master substrate 101 as shown in (c) of FIG. 1 as an interference fringe is exposed by use of, for example, a holographic exposure method (resist pattern forming step). The present embodiment is characterized by a formation method of a resist pattern in this resist pattern forming step. A specific formation method of a resist pattern will be described later.

Etching is applied to a surface of the master substrate 101 on which a resist pattern is formed, so that a grating pattern 103 having a grating groove is formed on a substrate surface as shown in (d) of FIG. 1. As an etching method, for example, ion beam etching can be exemplified. By applying etching using a resist pattern as a mask, as shown in (d) of FIG. 1, a blazed (serrated) grating groove can be formed on the substrate surface of the master substrate 101 (grating pattern forming step).

After that, by forming a metal thin film 104 on the grating pattern 103, the entire grating pattern 103 is covered with the metal thin film 104, and a grating surface is formed on a surface of the metal thin film 104 (film forming step). The metal thin film 104 can be formed on the grating pattern 103 by using, for example, aluminum, gold, platinum, or the like.

By the above manufacturing process, the master diffraction grating 100 having the master substrate 101 for transferring a metal thin film to a replica substrate of a replica diffraction grating can be manufactured. The manufactured master diffraction grating 100 has a configuration in which the metal thin film 104 is formed on the substrate surface of the master substrate 101, as shown in (e) of FIG. 1.

2. Device for Producing Master Diffraction Grating

Figure 2:
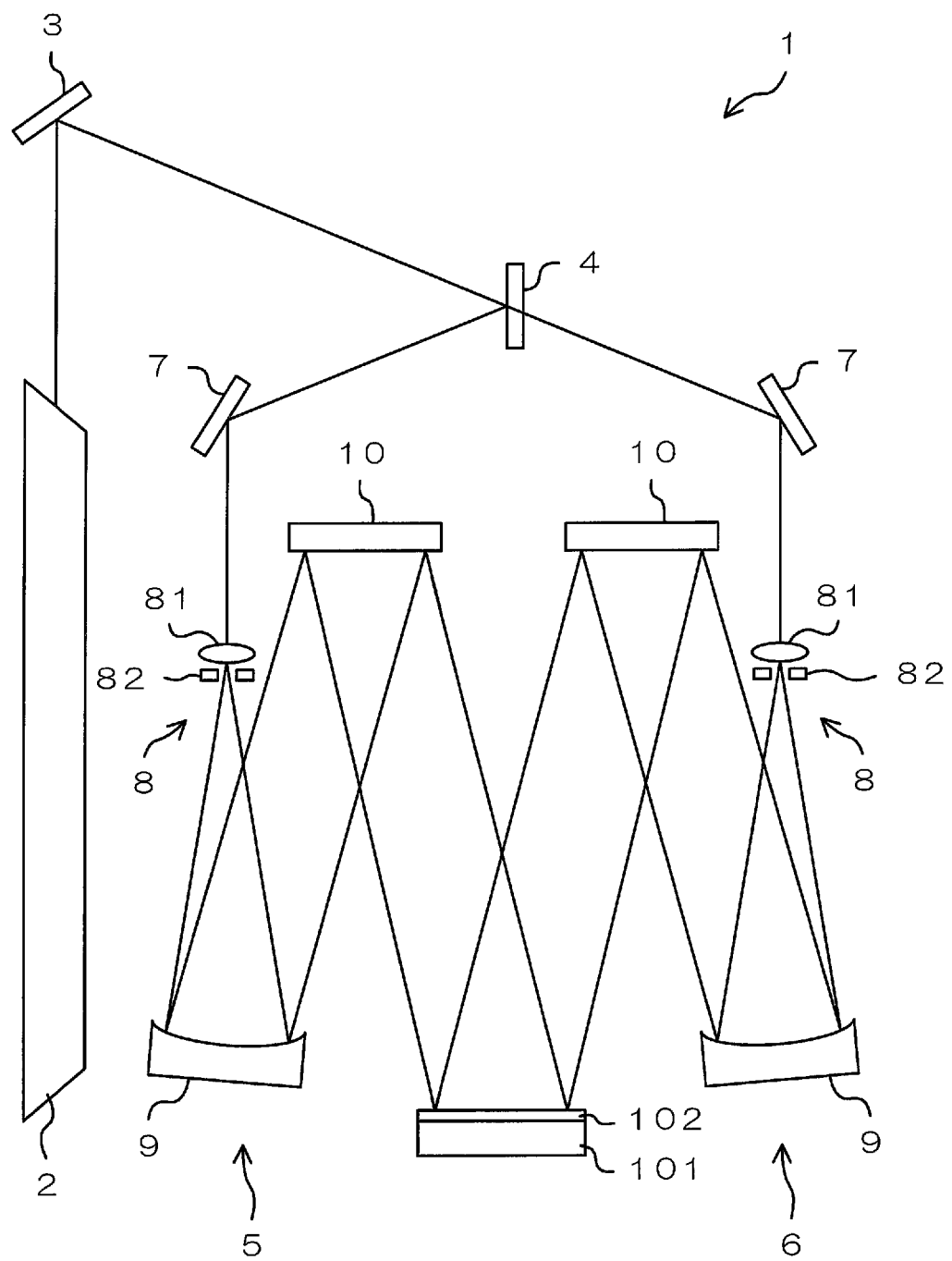
FIG. 2 is a schematic diagram showing an example of a device for manufacturing a master diffraction grating.

FIG. 2 is a schematic diagram showing an example of a device 1 for producing the master diffraction grating 100. The device 1 includes a laser light source 2, a plane mirror 3, a beam splitter 4, a plane mirror 7, a spatial filter 8, a concave mirror 9, and a plane mirror 10. A first light source unit 5 and a second light source unit 6 are composed of the spatial filter 8, the concave mirror 9, and the like, and have the same members disposed symmetrically to each other.

Laser light emitted from the laser light source 2 is reflected by the plane mirror 3 and then enters the beam splitter 4. At this time, the laser light reflected by the beam splitter 4 is reflected by one of the plane mirrors 7 and guided to the first light source unit 5 side, and the laser light that passes through the beam splitter 4 is reflected by the other one of the plane mirrors 7 and guided to the second light source unit 6 side. In each of the first light source unit 5 and the second light source unit 6, the laser light from the beam splitter 4 is incident on the spatial filter 8.

The spatial filter 8 includes a condenser lens 81 and a pinhole 82. Laser light incident on the spatial filter 8 is condensed by the condenser lens 81 and passes through the pinhole 82 disposed at the condensing position. In this manner, noise generated in an interference fringe can be suppressed, so that a resist pattern can be formed in a more excellent manner.

The laser light that passes through the spatial filter 8 is reflected by the concave mirror 9 to be made parallel, and then reflected by the plane mirror 10 to be guided to the master substrate 101 side. As described above, the photoresist layer 102 is formed in advance on the substrate surface of the master substrate 101, and the photoresist pattern 102 is irradiated with the laser light from the plane mirror 10 so that a resist pattern is formed.

At this time, since the photoresist layer 102 is irradiated with laser light from both the first light source unit 5 and the second light source unit 6, an interference fringe is obtained by two-beam interference, and a resist at a location corresponding to the interference fringe is exposed to light. However, the configuration may be such that the interference fringe is formed by interference of three or more light beams, without limitation to two-beam interference.

As described above, the laser light source 2, the plane mirror 3, the beam splitter 4, the plane mirror 7, the first light source unit 5 and the second light source unit 6, and the plane mirror 10 constitute a light source unit for forming an interference fringe (first interference fringe) by irradiating the substrate surface of the master substrate 101 with laser light. The present embodiment is characterized in that a second interference fringe is formed separately from the first interference fringe, and a resist pattern based on the first interference fringe and the second interference fringe is formed on the substrate surface of the master substrate 101.

3. Method for Forming Second Interference Fringe

Figure 3:
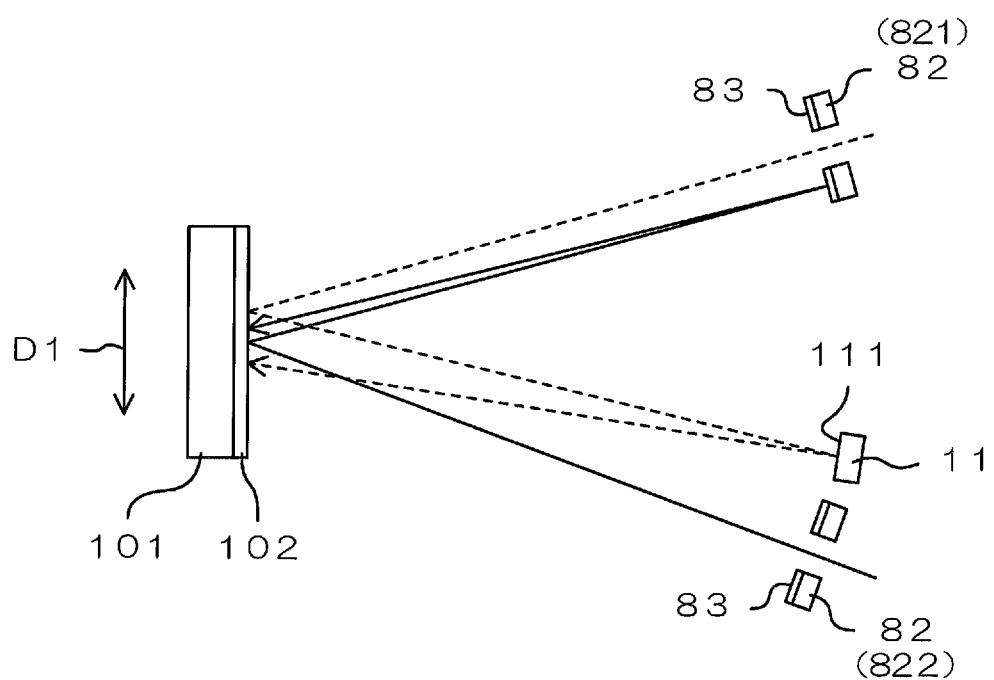
FIG. 3 is a schematic plan view for explaining a method for forming a second interference fringe.
Figure 4:
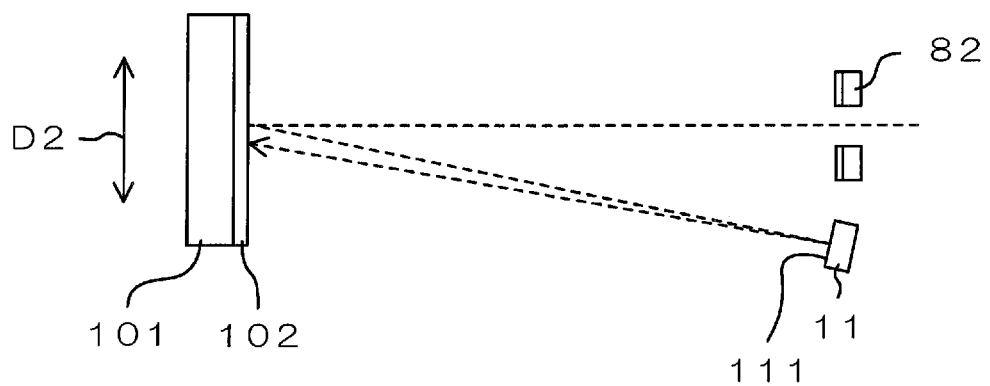
FIG. 4 is a schematic side view for explaining a method for forming the second interference fringe.

FIGS. 3 and 4 are a schematic diagram for explaining a method for forming the second interference fringe. FIG. 3 shows a schematic plan view, and FIG. 4 shows a schematic side view. In FIGS. 3 and 4, a positional relationship between the pinhole 82 and the master substrate 101 is shown in a simplified manner for the sake of clarity, and some members are omitted.

As shown in FIG. 3, an optical axis of laser light from each of the pinholes 82 toward the substrate surface of the master substrate 101 extends symmetrically with respect to a direction perpendicular to the substrate surface. The above-mentioned first interference fringe is formed by mutual interference of the laser light from each of the pinholes 82 with which the substrate surface (on the photoresist layer 102) of the master substrate 101 is directly irradiated. The first interference fringe formed in the above manner extends along a direction D2 perpendicular to a direction D1 in which a pair of the pinholes 82 are arranged, and this direction D2 is a direction in which grating grooves in the grating pattern 103 of the master diffraction grating 100 finally manufactured extend. On the other hand, the direction D1 is a wavelength dispersion direction in the grating pattern 103 of the master diffraction grating 100 finally manufactured. This dispersion direction matches with a wavelength dispersion direction in the replica diffraction grating manufactured by using the master diffraction grating 100 as a matrix.

The second interference fringe is formed by reflecting the laser light reflected on the substrate surface of the master substrate 101 again to the substrate surface side. For the above reason, in the present embodiment, a reflecting member 11 for reflecting the laser light reflected on the substrate surface of the master substrate 101 and guiding the laser light again to the substrate surface side is provided.

As shown in FIG. 4, the reflecting member 11 is disposed so as to be displaced in the direction D2 perpendicular to the wavelength dispersion direction D1 with respect to the pinhole 82 positioned on an axis perpendicular to the substrate surface. In this manner, the reflecting member 11 is disposed at a position avoiding a light flux region reaching the substrate surface of the master substrate 101. That is, the reflecting member 11 is disposed at a position displaced along a direction parallel to the direction D2 in which the first interference fringe extends (a position displaced along a direction orthogonal to the wavelength dispersion direction) with respect to an optical axis of the laser beam. Note that, in FIG. 3, the position of the reflecting member 11 is shown at a position different from the actual position for the sake of clarity.

As shown in FIG. 3, when the second interference fringe is formed, the laser light that has passed through one pinhole 821 (shown by a broken line) is reflected on the substrate surface of the master substrate 101, and then reflected on a reflective surface 111 of the reflecting member 11 and guided again to the substrate surface side. The laser light (shown by a solid line) that has passed through the other pinhole 822 is reflected on the substrate surface of the master substrate 101, and then reflected on a peripheral portion of an opening of the one pinhole 821 and guided again to the substrate surface side. In this manner, the laser light that has passed through the one pinhole 821 and the laser light that has passed through the other pinhole 822 interfere with each other at a position where optical path lengths are the same, and the second interference fringe is formed.

In the present embodiment, a reflective surface 83 made from, for example, metal such as aluminum is formed on a peripheral portion of an opening of the pinhole 821. In this manner, the laser light (shown by a solid line) that has passed through the other pinhole 822 is reflected on the reflective surface 83 on the one pinhole 821, and guided to the substrate surface side. However, the configuration is not limited to such a configuration, and a reflecting member for reflecting the laser light that has passed through the other pinhole 822 to the substrate surface side may be provided in the vicinity of the one pinhole 821.

As described above, in the present embodiment, the laser light is emitted from the laser light source 2, so that the first interference fringe and the second interference fringe can be simultaneously formed. In this manner, in the resist pattern forming step, a resist pattern based on the first interference fringe and the second interference fringe is formed on the substrate surface of the master substrate 101. As a result, in the grating pattern forming step, the grating pattern 103 in which the presence of the reflecting member 11 is added as a hologram is formed on the substrate surface of the master substrate 101.

In a case where a replica substrate is manufactured using the finally manufactured master diffraction grating 100 as a matrix, when a grating surface of the replica substrate is irradiated with light of a specific wavelength from a specific direction, a mark having a shape corresponding to the reflected light from the reflecting member 11 is projected in a specific direction, and a hologram is reproduced.

4. Reproduction of Hologram

Figure 5:
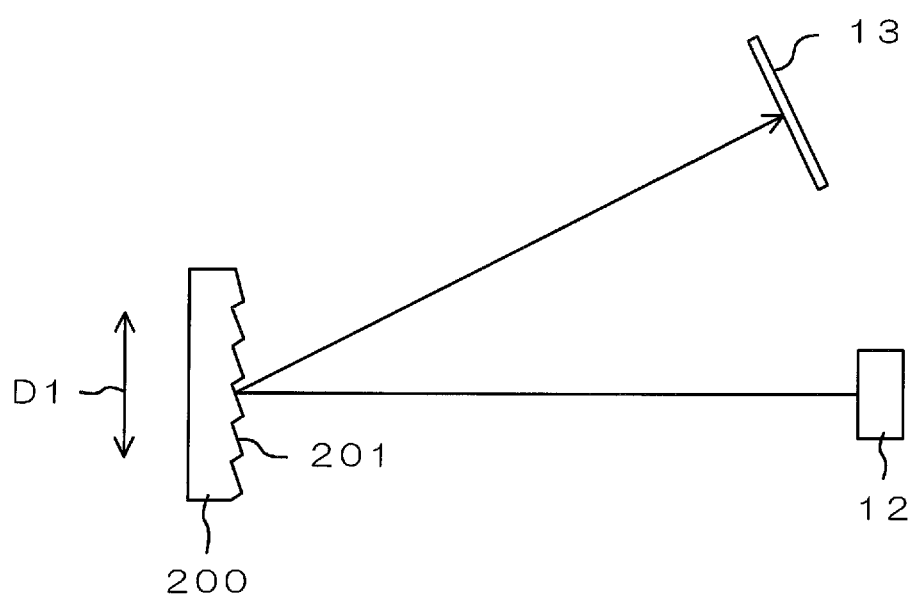
FIG. 5 is a schematic diagram for explaining a mode when a hologram is reproduced.

FIG. 5 is a schematic diagram for explaining a mode when a hologram is reproduced. When a hologram is reproduced, a hologram reproducing light source 12 irradiates a grating surface 201 of a replica diffraction grating 200 with light of a specific wavelength. The light with which the grating surface 201 of the replica diffraction grating 200 is irradiated is reflected in a specific direction according to the irradiation direction. For this reason, if a medium 13 such as paper is disposed in the reflection direction of light, the hologram can be reproduced on the medium 13 together with the reflected light.

The reproduced hologram is a mark having a shape corresponding to the reflected light from the reflecting member 11. Therefore, for example, in a case where the reflecting member 11 has the reflective surface 111 having a circular shape and a uniform reflectance, a circular mark is projected on the medium 13 together with the reflected light. From the viewpoint of easily checking whether or not the replica diffraction grating 200 is a counterfeit product based on whether or not a mark is projected on the medium 13, an illustration portion (not shown) having a different reflectance is preferably partially formed on the reflective surface 111 of the reflecting member 11. In this case, a shape of the illustration portion is projected on the medium 13 as a mark.

5. Action and Effect (1) In the present embodiment, not only the first interference fringe formed by irradiating the substrate surface of the master substrate 101 with the laser light, but also the second interference fringe formed by reflecting the laser light reflected on the substrate surface of the master substrate 101 on the reflecting member 11 and guiding the laser light again to the substrate surface is used, so that a resist pattern is formed on the substrate surface of the master substrate 101. In a case where the replica diffraction grating 200 is produced using the master diffraction grating 100 produced as described above as a matrix, when the grating surface 201 of the replica diffraction grating 200 is irradiated with light of a specific wavelength from a specific direction, a mark having a shape corresponding to the reflected light from the reflecting member 11 is projected in a specific direction together with the reflected light. Therefore, whether or not the replica diffraction grating 200 is a counterfeit product can be easily checked based on whether or not a mark is projected.

(2) In the present embodiment, the reflecting member 11 is disposed at a position displaced along a direction parallel to the direction D2 in which the first interference fringe extends, with respect to an optical axis of the laser light from each of the pinholes 82. For this reason, when the grating surface 201 of the replica diffraction grating 200 produced using the manufactured master diffraction grating 100 as a matrix is irradiated with light of a specific wavelength from a specific direction, a mark is projected in a direction different from the wavelength dispersion direction D1 by the grating surface 201. In this manner, a wavelength can be dispersed with performance similar to that in a case where no mark is projected. For this reason, original performance of the replica diffraction grating 200 can be prevented from being impaired.

(3) The reflecting member 11 may be disposed between the concave mirror 9 and the substrate surface of the master substrate 101. In this case, since the laser light is made parallel by the concave mirror 9, the parallel light is reflected by the reflecting member 11 and guided again to the substrate surface, so that the second interference fringe can be formed. In a case where the second interference fringe is formed in the above manner, when the grating surface 201 of the replica diffraction grating 200 produced using the manufactured master diffraction grating 100 as a matrix is irradiated with light of a specific wavelength from a specific direction, a mark is projected at a position further away from the wavelength dispersion direction D1 by the grating surface 201. In this manner, the original performance of the replica diffraction grating 200 can be effectively prevented from being impaired.

6. Variation

In the above embodiment, the configuration in which the light source unit includes the plane mirror 7 and the plane mirror 10 is described. However, the present invention is not limited to the above configuration, and the light source unit may have any of the above members omitted, or may include other members as long as the light source unit has a configuration capable of forming an interference fringe.

The master diffraction grating 100 and the replica diffraction grating 200 are not limited to a planar diffraction grating having a grating pattern formed on a plane, but may be a concave diffraction grating having a grating pattern formed on a concave curved surface.

The invention claimed is:

1. A device for producing a master diffraction grating serving as a matrix for producing a replica diffraction grating, the device comprising:
   a light source unit for forming a first interference fringe by irradiating a substrate surface of a master substrate with light; and
   a reflecting member for reflecting light from the light source unit reflected on the substrate surface of the master substrate and guiding the light again to the substrate surface, so that a second interference fringe is formed, wherein
   a resist pattern based on the first interference fringe and the second interference fringe is formed on the substrate surface of the master substrate.

2. The device for producing a master diffraction grating according to claim 1, wherein
   the reflecting member is disposed at a position displaced along a direction parallel to a direction in which the first interference fringe extends, with respect to an optical axis of light from the light source unit.

3. The device for producing a master diffraction grating according to claim 2, wherein
   the light source unit includes a condenser lens, a pinhole through which light condensed by the condenser lens passes, and a concave mirror for making light that has passed through the pinhole parallel, and
   the reflecting member is disposed between the concave mirror and the substrate surface of the master substrate.

4. A method for producing a master diffraction grating serving as a matrix for producing a replica diffraction grating, the method comprising:
   a resist pattern forming step of forming a first interference fringe by irradiating a substrate surface of a master substrate with light from a light source unit, and forming a second interference fringe by reflecting light from the light source unit reflected on the substrate surface of the master substrate on a reflecting member and guiding again the light to the substrate surface, so as to form a resist pattern based on the first interference fringe and the second interference fringe on the substrate surface of the master substrate;
   a grating pattern forming step of forming a grating pattern having a grating groove on the substrate surface of the master substrate by performing etching using the resist pattern as a mask; and
   a film forming step of forming a metal thin film on the grating pattern.

5. The method for producing a master diffraction grating according to claim 4, wherein
   the reflecting member is disposed at a position displaced along a direction parallel to a direction in which the first interference fringe extends, with respect to an optical axis of light from the light source unit.

6. The method for producing a master diffraction grating according to claim 5, wherein
   the light source unit includes a condenser lens, a pinhole through which light condensed by the condenser lens passes, and a concave mirror for making light that has passed through the pinhole parallel, and the reflecting member is disposed between the concave mirror and the substrate surface of the master substrate.

\* \* \* \* \*